United States Patent [19]
Staiger

[11] Patent Number: 5,479,415
[45] Date of Patent: Dec. 26, 1995

[54] METHOD AND APPARATUS FOR GENERATING TEST PULSES

[75] Inventor: Dieter E. Staiger, Weil im Schönbuch, Germany

[73] Assignee: International Business Machines Corporation, Armonk, N.Y.

[21] Appl. No.: 209,671

[22] Filed: Mar. 10, 1994

Related U.S. Application Data

[63] Continuation of Ser. No. 108,780, Aug. 18, 1993, abandoned, which is a continuation of Ser. No. 811,759, Dec. 20, 1991, abandoned.

[30] Foreign Application Priority Data

Dec. 28, 1990 [EP] European Pat. Off. .............. 90125728

[51] Int. Cl.⁶ ..................................................... G06F 11/00
[52] U.S. Cl. ............................................. 371/27; 371/22.1
[58] Field of Search .......................... 371/27, 22.1, 15.1, 371/57.2, 61, 28

[56] References Cited

U.S. PATENT DOCUMENTS

| | | | |
|---|---|---|---|
| 3,772,595 | 11/1973 | De Wolf et al. | 324/73 R |
| 4,013,951 | 3/1977 | Ezoe et al. | 371/27 |
| 4,293,950 | 10/1981 | Shimizu et al. | 371/27 |
| 4,389,614 | 6/1983 | Staiger | 371/27 |
| 4,402,081 | 8/1983 | Ichmiya et al. | 371/27 |
| 4,450,560 | 5/1984 | Conner | 371/22.1 |
| 4,802,168 | 1/1989 | Yamanoi et al. | 371/27 |
| 4,855,681 | 8/1989 | Millham | 371/27 |
| 4,998,025 | 3/1991 | Watanabe | 371/27 |

*Primary Examiner*—Robert W. Beausoliel, Jr.
*Assistant Examiner*—Phung My Chung
*Attorney, Agent, or Firm*—James M. Leas

[57] ABSTRACT

A circuit for generating product-specific digital test signals for testing memories, etc., the test signals comprising a test pulse occurring during a pulse interval and generated from predetermined data and timing signals. A format memory (7-11) stores addressable test signal formats (in the form of digital values denoting the test signals curve unrelated to time) for each data signal. These digital values are read out time parallel to each other and are combined by a flip-flop circuit (7-24) in the order of their occurrence during the pulse interval with timing signals for the respective data signal to form a control signal. The internal signal delay of the flip-flop circuit determining the generation of the test signals is invariably of the same value. This circuit may not only be used for test purposes but also generally for computer control, in particular for addressing main memories and buffers.

12 Claims, 9 Drawing Sheets

| TEST SIGNAL (SIGNAL NAME) | FORMAT CIRCUIT + TIMER | POLARITY AND LOGICAL MEANING | TEST SIGNAL FORMAT |
|---|---|---|---|
| ADDRESS | CHANNEL 1 | +≙ACTIVE | NRZ |
| DATA-IN | CHANNEL 2 | LOW ≙ "0" HIGH ≙ "1" | SBC |
| WRITE | CHANNEL 3 | −≙ACTIVE | RT1 |

METHOD AND APPARATUS FOR GENERATING TEST PULSES

This is a continuation of copending application Ser. No. 08/108,780 filed on Aug. 18, 1993, now abandoned which is a continuation of copending application Ser. No. 07/811,759 filed Dec. 20, 1991, now abandoned.

BACKGROUND OF THE INVENTION

1. Field of the Invention

The invention relates to a program-controlled method and apparatus for generating pulses of a predetermined time relation during successive intervals with a very high time resolution.

2. Background Art

Pulse trains of this kind are required for computer control means, such as those used to address main memories or buffers, and in particular for testing memory products (memories and associated buffers) of digital circuits, etc.

Memory products are tested by subjecting them to a predetermined pulse pattern. Their response to the pulse pattern applied is stored and compared with desired (theoretical) values. The result of the comparison indicates whether the memory product is operating as desired or whether errors have occurred at particular points.

The pulse train to be generated depends on the memory product specifications. On the basis of such (theoretical) values, the required pulse train is generated by a pulse generator.

Optimal testing should consider the fact that an event connected with the product to be tested may necessitate replacing a pulse train. This means that following such an event, the original pulse train may have to be replaced by another one.

Previously, the time resolution and accuracy of such pulse trains were limited by the circuits available for their generation and by technological and speed aspects.

FIG. 1A is a schematic simplified clock diagram of the state of the art test signal generation.

As shown in that figure, the test signals are generated by a test signal format-specific hardware circuit 1-1 from data and time generator signals. These test signals are applied to the product to be tested 1-2.

There may be various types of test signals. The product to be tested receives the test signals on different lines. For memory testing, the following test signal lines are provided, for example:

address lines;

write lines in response to which information is written into addressed memory positions;

read lines in response to which information is read from addressed memory positions;

data lines for carrying information (DATA IN) to be written into addressed memory positions;

data lines for carrying information (DATA OUT) to be read from addressed memory positions.

FIG. 1B is a schematic block diagram of a prior art test system, considering the generation of data and timing signals. This test system serves to generate test signal patterns. It comprises a time interval generator 1-3 which is connected to a processor 1-4. This processor supplies data for generating data signals in the signal processor 1-5, timing signals in the timer 1-6, and for program-controlling the format circuit 1-7 (see also FIG. 2). Signal processor 1-5 is preceded by a signal processor program memory SPPS 1-8 containing the operation codes for signal processor 1-5. Timer 1-6 is preceded by a timer memory 1-9 containing the time values for the timing signals during a particular time interval. The format circuit combines the data and the timing signals and assigns the test signal formats to the data signals. Embodiments of the timer 1-3 and the processor 1-4 are described in the U.S. Pat. No. 4,203,543 and in the U.S. Pat. No. 4,263,669. (The subject-matter of the latter patent constitutes an improvement over the former patent.) Details of the timer 1-6 are described in the U.S. Pat. No. 4,389,614 and in the U.S. Pat. No. 4,648,042. (The subject-matter of the latter patent constitutes an improvement over the former patent.)

According to the state of the art, the signal processor, if used only for address generation, may be a binary synchronous counter or, in the case of more complex data signals, an arithmetic logic circuit. In other words, to get from an address XX to an address YY, binary incrementation or decrementation or a logical address branch eliminating redundant count steps, may be used.

The essential disadvantage of prior art format circuits (1-7) is that their time inaccuracy is not correctable within tolerable limits. As the cycle times of the products to be tested become shorter, ever "faster" test systems are needed. However, even assuming "faster" components created as a result of such technical progress are used, the test systems available would still fall short of the required accuracy standards. Particular indispensable circuit-related components or component groups in known test systems have different signal paths and different delays leading to time inaccuracies. For example, internally used test systems of the applicant comprise flip-flop circuits with set, reset and clock inputs as well as XOR-circuits with, different signal delays between input and output.

This disadvantage may not be overcome either by interleaving or ordering two or several "slower" signal trains, as this would again necessitate using the previously mentioned XOR-circuits. The design of known interleave circuits is such that they only permit combining signals of uniform polarity in the real time mode. This leads to functional limitations in the interleave real time test mode.

Therefore, it is the object of the invention to provide test systems for ever "faster" products, such as memories and digital circuits, which are more accurate and universally applicable to test signal formats selectable in the interleave real time mode. Another object of the invention is to generate highly time-accurate digital control signals from data and timing signals, in particular for computer control means.

SUMMARY OF THE INVENTION

These objects are accomplished according to the present invention in a method and apparatus for generating product-specific digital test signals. According to such methods, the digital test signals are characterized by curves specified by predetermined test signal formats, and are generated in response to test data, timer control and test format signals, for testing a digital circuit. A data test signal causes a test pulse to occur during a pulse interval, and the test signal curve comprises such test pulse and signals adjacent thereto within the interval, such test pulse and adjacent signals having predetermined levels according to the predetermined test signal formats. The present invention, according to one primary aspect, involves storing, for each of a plurality of predetermined test signal formats, at an addressable format memory location, digital values representing the level of the actual test pulse and the predetermined format-specific levels of the signals adjacent the test pulse. In response to the timer control signals, timing signals are generated from digitally stored values representing predetermined time intervals of the signals of the test signal curve. The format memory location is addressed by a data signal and a test format signal, and in response to such addressing, the stored digital values for the actual test pulse and for the signals adjacent thereto are provided on a plurality of signal lines corresponding to the number of level changes in the test signal curve. Finally, the digital values on the plurality of signal lines are clocked with the timing signals. Thus, the test signal curve is generated having the test signal and adjacent signals at the predetermined levels and timing.

Other features and aspects of the invention will become readily apparent once the principles thereof, as set forth herein, are understood.

BRIEF DESCRIPTION OF THE DRAWINGS

One way of carrying out the invention will be described in detail below with reference to drawings which illustrate the preferred embodiment thereof, in which.

DETAILED DESCRIPTION OF THE PREFERRED EMBODIMENT

Initially, the interaction of the test, data and timing signals and the test signal formats (FIG. 4) will be described so that the invention may be more readily appreciated. An example of test, data and timing signals will be described with reference to FIG. 3.

Depending upon the product test requirements, the test signals must have particular formats defining their curve during the individual pulse intervals (hereinafter referred to as cycles). Details of test signal formats will be described with reference to FIG. 4.

Figure 1A:
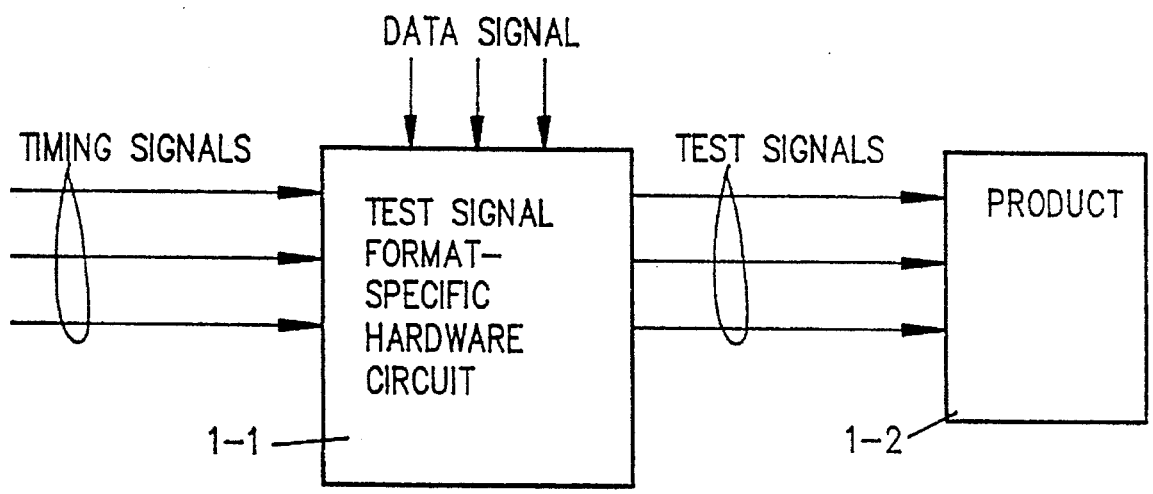
FIG. 1A is a schematic simplified block diagram of the state of the art test signal generation.

According to the state of the art, it was necessary to provide a test signal format-specific hardware circuit 1-1 (FIG. 1A) for each test signal format required. This circuit received the data and timing signals as input signals. A data signal may be, for instance, address data for a cycle or data according to which a binary "0" or a binary "1" is applied to the product to be tested in a particular cycle. Data signals may also comprise control data indicating, for example, whether information is to be written into or read from the product to be tested. The data signals will be described with reference to FIG. 3.

The timing signals (see also FIG. 3) denote those times during the cycles at which data or control information is to be made available. Thus, for example, the start and the end of a time during which a binary "0" is applied to the product to be tested is marked by timing signals. Such data and timing signals are used to generate the test signal for a particular format. For the SBC (surrounded by complements) format, for example, which is used for the test signal "DATA-IN" (FIG. 3), the associated SBC format-specific hardware circuit 1-1 generates the test signal "DATA-IN" from the relevant data signal DATA.GEN and the timing signals A-DATA.GEN., B-DATA.GEN., C-DATA.GEN. For other test signal formats, the design of the hardware circuit 1-1 would vary accordingly. However, such state of the art test signal format-specific hardware circuits have a number of disadvantages, of which the poor time accuracy during "fast" testing is but one example.

Figure 2:
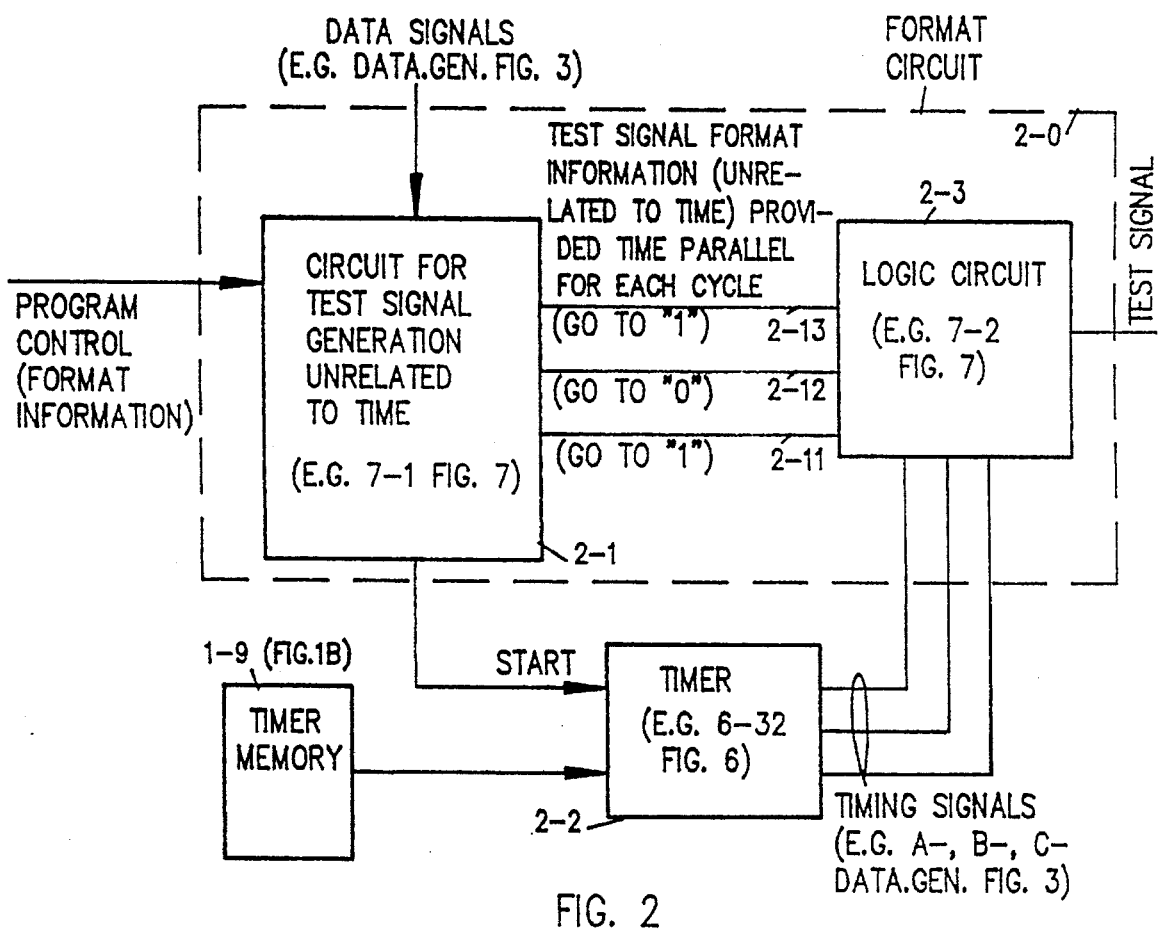
FIG. 2 is a schematic block diagram showing a format circuit for generating test signals.

FIG. 2 is a schematic block diagram for generating test signals according to the preferred embodiment of the present invention. The test signals are generated from data and timing signals specifying the test signal format. For this purpose, a timer 2-2, such as that disclosed in the U.S. Pat. No. 4,648,042, may be used. Such a timer is required for each data signal. Timer 2-2 receives the time values from an associated timer memory 1-9- The test signals are generated in format circuit 2-0. How this is done in the circuit of FIG. 2 may be seen from FIG. 3 which shows a timing diagram for an example of predetermined test, timing and data signals in two cycles and which is based on specifications for testing a semiconductor memory:

cycle 1 5 nsec cycle 2 6 nsec.

These values apply to the test signals "ADDRESS", "DATA-IN" and "WRITE" for the semiconductor memory to be tested. For cycle 1, the predetermined address XX is addressed through channel 1 (see also FIG. 5); the predetermined address for cycle 2 is YY. Addressing is effected by address buses.

All test signals have to be in a predetermined format. Test signal format details will be described in conjunction with FIG. 4. For the test signal "ADDRESS", the format NRZ (no return to zero) is provided. The test signal "DATA-IN" (FIGS. 3, 5) is associated with a logical "0" for a high voltage level and a logical "1" for a low voltage level. The format provided for the test signal "DATA-IN" is SBC (surrounded by complements, i.e., a logical "0" is surrounded by logical ones and a logical "1" by logical zeros).

The test signal "WRITE" (FIGS. 3 and 5), during which the "DATA-IN" information may be written into the addressed memory position, is active for a negative voltage level "−". This test signal "WRITE" has the format RT1 (return to 1=logical "1"). In cycle 1, a logical "0" is written into the address XX and in cycle 2, a logical "1" into the address YY. The curve of the voltages and pulses occurring in cycles 1 and 2 is shown in a time-aligned fashion in FIG. 3. In cycle 1, the address XX is active from the time T1 (counting from the start of this cycle), whereas in cycle 2, the address YY is active from the time T2 (counting from the start of the latter cycle).

During the test signal "WRITE" in cycles 1 and 2, a logical "0" (cycle 1) and a logical "1" (cycle 2) are written into the addressed memory positions XX and YY.

As the test signal "DATA-IN" must be in the SBC format, it comprises in cycle 1 on either side of the "0" the necessary "1" complement LCO1 and RCO1 and in cycle 2 on either side of the "1" the necessary "0" complement LCO2 and RCO2. The test signal "ADDRESS" (on channel 1 in FIG. 5), the test signal "DATA-IN" (on channel 2 in FIG. 5), and the test signal "WRITE" (on channel 3 in FIG. 5) correspond to given product specifications according to FIG. 3. The timers 6-31, 6-32 and 6-33 for generating timing signals and a signal generator 6-2 for generating data signals (FIG. 6) must comply with those specifications to generate time-accurate pulses and voltage curves from the originally digital values of the test signals. From the timing and data signals, test signals are generated under circuit control. Timer 6-31 in FIG. 6 for the data signal "ADDRESS.GEN" (FIGS. 6 and 3) generates the times marking the start of cycles 1 and 2 and the pulses TA1 and TA2 marking the start of addressing on a time phase scheme, or "plane", A, the significance of which will be described in detail further on. The term time plane A, as used in this context, refers to pulses which are generated independently of those on other planes B and C. The output data of the different time planes is eventually merged by format circuits (6-41, 6-42, 6-43) for test signal generation.

Figure 3:
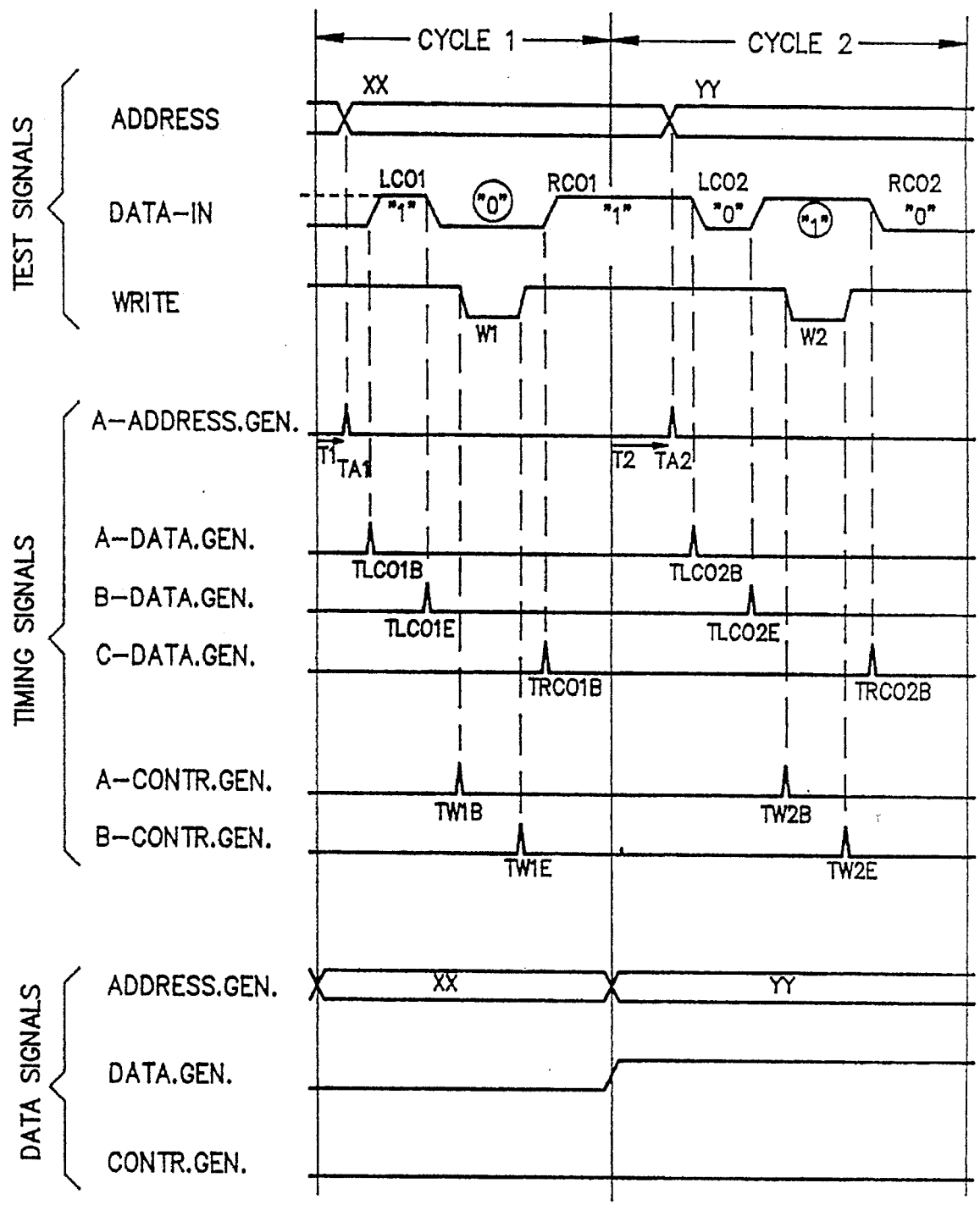
FIG. 3 is a timing diagram showing test, timing and data signals during two pulse intervals (cycles) of operation of the preferred embodiment.
Figure 6:
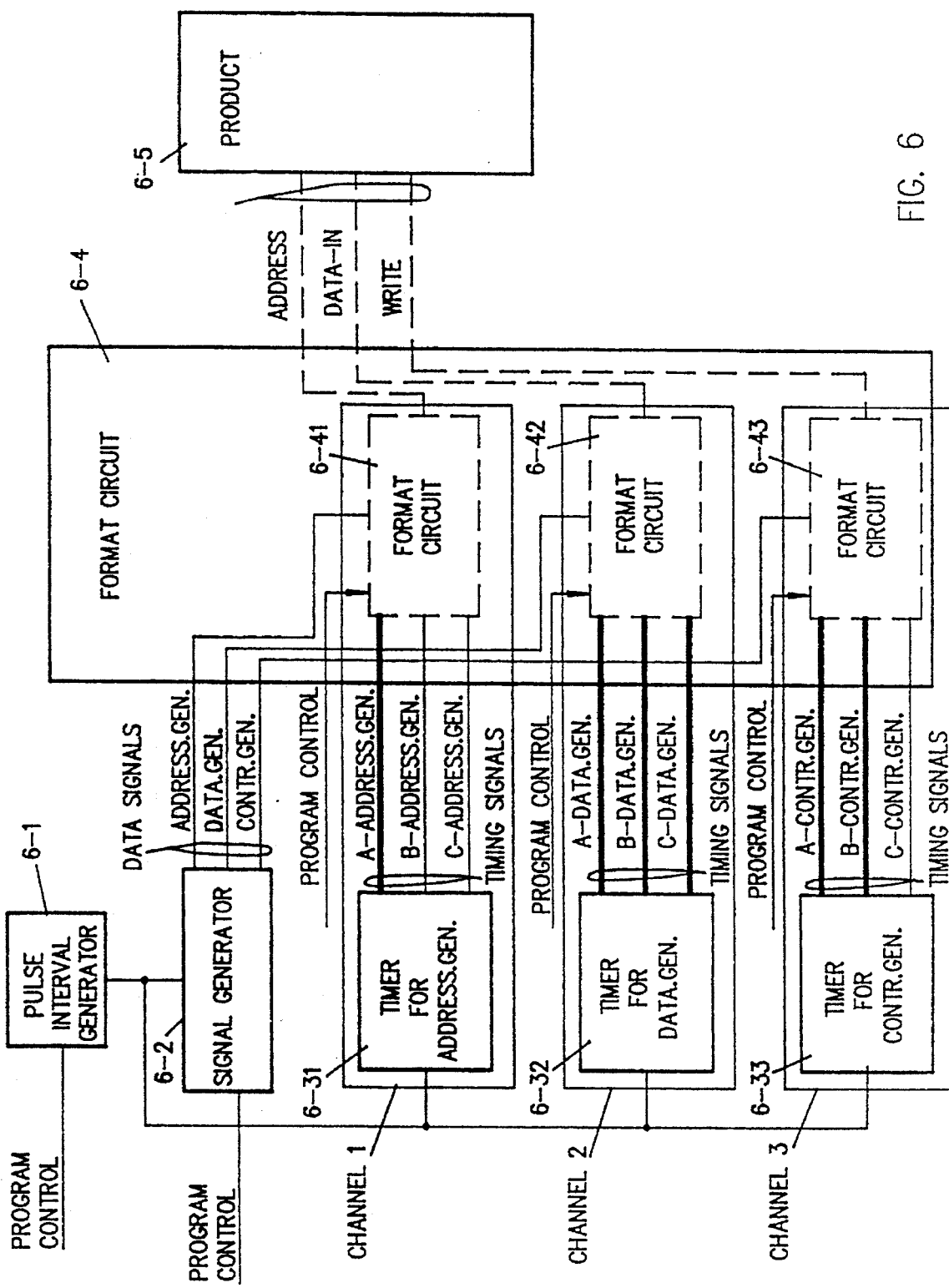
FIG. 6 is a block diagram showing the generation of test signals from data and timing signals by a series of format and timer circuits with which each data signal is associated.

For the data signal "DATA.GEN.", the timing signals of time planes A, B and C are designated as "A-DATA.GEN.", "B- DATA.GEN." and "C-DATA.GEN." (FIGS. 3 and 6). On time plane A, "A-DATA.GEN." in cycles 1 and 2 predetermines the pulses TLCO1B and TLCO2B marking the start of the left complement pulses LCO1 or LCO2. On time plane B, the pulses TLCO1E TLCO2E, denoting the end of LCO1 and LCO2, respectively, are predetermined.

On time plane C, "C-DATA.GEN" predetermines the pulses TRCO1B and TRCO2B which mark the start of the right complement pulses RCO1 and RCO2 in cycle 1 or 2 for "DATA-IN". "A-CONTR.GEN" predetermines the pulses TW1B and TW2B for data signal "CONTR-.GEN". These pulses mark the start of the write pulses W1 and W2. On time plane B, "B-CONTR.GEN" predetermines the pulses TW1E and TW2E marking the end of the write pulses W1 and W2.

Figures 4, 5:
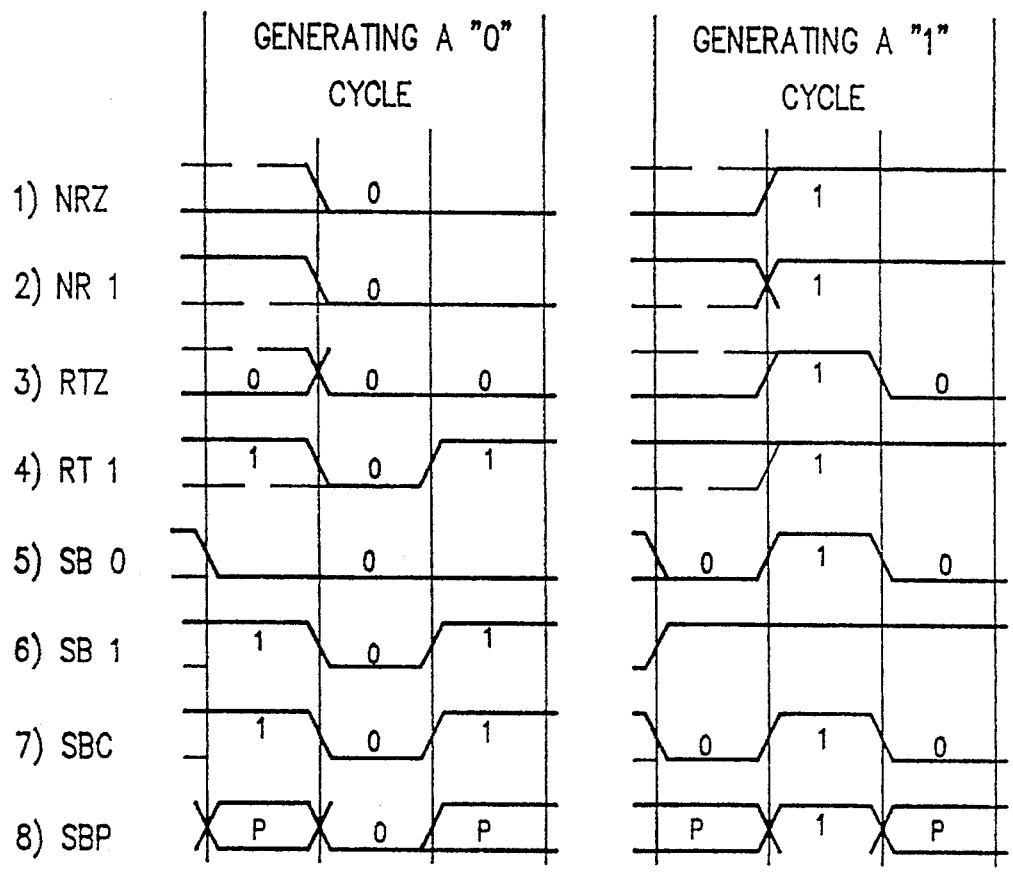
FIG. 4 is a survey of different test signal formats.
FIG. 5 is a test signal table showing the format and timer circuits associated with each test signal, the polarity and the logical meaning of the signal value and the test signal formats.

FIG. 4 is a survey of the test signal formats required for testing. The time axis is the abscissa and the pulse amplitude the ordinate. The illustration covers one cycle during which a logical "0" (left column) and a logical "1" (right column) are generated. The values logical zero "0" and logical one "1" are associated with the binary voltage levels of the pulses. The cycle is subdivided into three segments, a logical "0" or "1" being associated with each segment.

The format designations and their meanings are listed below.

| | |
|---|---|
| NRZ | no return to zero ("0") |
| NR'1' | no return to "1" |
| RTZ | return to zero ("0") |
| RT'1' | return to "1" |
| SB'0' | surrounded by "0's" |
| SB'1' | surrounded by "1's" |
| SBC | surrounded by complements |
| SBP | surrounded by previous data values |

For the test signal format NRZ, the voltage curve will be explained below.

When a "0" (left column) is generated in the center segment of the cycle, there are two options—the voltage level in the left time segment is zero (solid line) or one (broken line). After the "0" has been generated in the center time segment, the voltage level in the right segment remains zero; a return to "zero" which the format prohibits is of no significance here, as the signal level in the center segment is zero; if it were one, the signal level in the right time segment would be prevented from returning to zero.

When a "1" (right column) is generated in the center time segment of the cycle, there are again two options—the voltage level in the left time segment is one (broken line) or zero (solid line). After the logical "1" has been generated in the center time segment, the test signal format specifying "no return to zero" prevents the voltage level in the right time segment from dropping to zero.

This applies by analogy to the other test signal formats.

The different formats are characterized in that in each cycle there is either one change of state (e.g. in the case of NRZ), or there are two or three such changes (in the case of RT1 and SBO and SBC, respectively). In the format SBP (P being derived from previous), the logical "1" in the center segment of cycle n+1 is surrounded by the same logical values (in this case ones) as the logical "0" in the center segment of cycle n.

Figure 7:
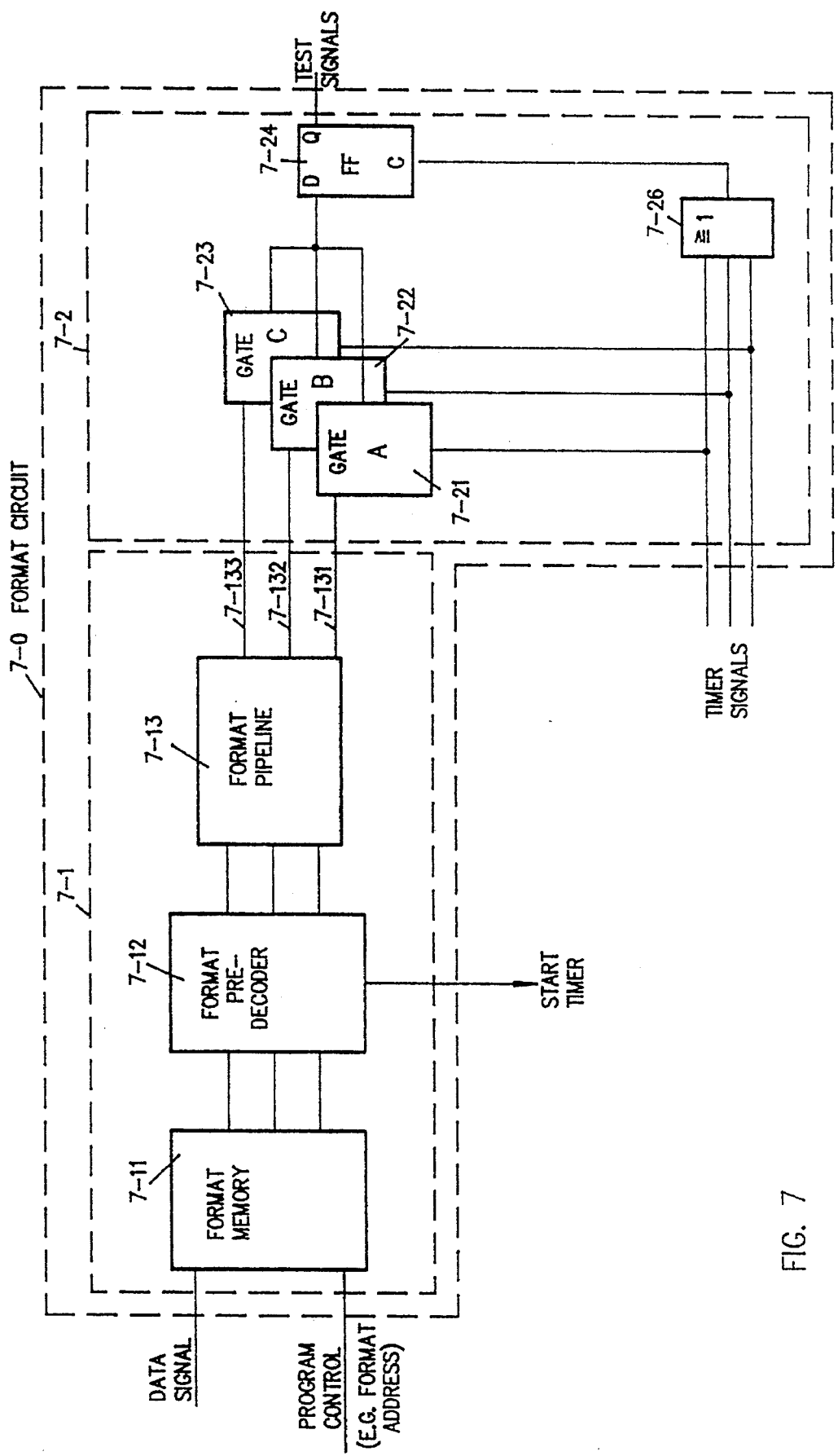
FIG. 7 is a block diagram of a format circuit.

With the test, timing and data signals of FIG. 3 being known, it is easier to appreciate the operation of the circuit shown in FIG. 2. As previously mentioned, a test signal is generated in block 2-0, called format circuit. This format circuit consists of two essential components: a circuit for test signal format generation without time relation 2-1 (details of such a circuit being shown, for example, in FIG. 7, block 7-1) and a logic circuit 2-3 (further details of which are shown in FIG. 7, block 7-2). Time parallel for each cycle, block 2-1, using program-controlled format data, generates test signal format data unrelated to time and a start signal for timer 2-2. The logic circuit 2-3 combines the test signal format data of block 2-1 and the timing signals of the timer 2-2 to form the test signal. The special characteristic of test signal format data unrelated to time at the output of block 2-1 is that the formatted data signals for each cycle appear unrelated to time, i.e. time-parallel to the start of the cycle. In other words, for a test signal, say, "DATA-IN" in cycle 1, FIG. 3, the following data would appear in binary form at three parallel outputs 2-11, 2-12, 2-13 of block 2-1:

| | |
|---|---|
| bottom-most line 2-11: | go to "1"; |
| center line 2-12: | go to "0"; |
| top-most line 2-13: | go to "1". |

This means that in the absence of predetermined signal change times in cycle 1, the serial curve of the "DATA-IN" signal is defined by the information go to "1"-
go to "0"-
go to "1"

as time passes ("1" complement LCO1 followed by a logical "0", which in turn is followed by a "1" complement RCO1).

The information defining the time serial curve of the "DATA-IN" signal is emitted time parallel, i.e., simultaneously, at the outputs of block 2-1. As a result, data on the serial signal curve (unrelated to time) is available at any time during the entire cycle. This test signal format information is combined with the timing signals in logic circuit 2-3 such that the latter relates the serial curve of the test signals in a cycle to the times defined by the timing signals, thus generating the time-related serial curve of the test signal, e.g. "DATA-IN" in FIG. 3.

The different time planes A, B, C in conjunction with the circuit of FIG. 7 will be described by way of the test signal "DATA-IN" (FIGS. 3 and 6). Format SBC (surrounded by complements), which is used for the test signal "DATA-IN", implies three changes in state for each cycle, namely, from "1" complement LCO1 to logical "0", then to "1" complement RCO1 in cycle 1 or, in cycle 2, from "0" complement LCO2 to logical "1" and finally to "0" complement RCO2. For the data "1"-"0"-"1" in cycle 1, the start of the "1" complement LCO1 on the first time plane A is defined by a pulse TLCO1B (timing signal "A-DATA.GEN.", FIG. 3). The end of the "1" complement LCO1 is marked by pulse TLCO1E on a second, B, plane. The relevant timing signal is designated as "B- DATA.GEN." in FIG. 3. Pulse TLCO1E also triggers the start of the logical "0" in "DATA-IN", the end of which coincides with the start of the subsequent "1" complement RCO1. This time is defined by a pulse TRCO1B on a third, C, plane. The relevant timing signal is designated as "C-DATA.GEN.". Thus, for the test signal "DATA-IN" there are three time planes for the timing signals. Accordingly, the output of circuit 2-1, FIG. 2, is provided with three lines 2-11, 2-12, 2-13.

Lines 2-11, 2-12 and 2-13 respectively carry the information go to "1", go to "0" and go to "1". In the logic circuit 2-3, FIG. 2, as will be described in greater detail in conjunction with FIG. 7, the information on lines 2-11, 2-12 and 2-13 is combined with the relevant timing signals for time planes A, B, C to form the test signal, in this case "DATA-IN". It is pointed out that the number of time planes to be considered depends upon the number of test signal format changes occurring during a cycle. For the present example of the test signal "DATA-IN" in the format SBC there are three time planes, whereas for other formats with fewer or more state changes there may be fewer or more time planes. In practice, each circuit 2-1 for test signal format generation is unrelated to time, and each timer circuit 2-2 is provided with a maximum number of time planes corresponding to the maximum number of conceivable state changes of a test signal. The test signals "ADDRESS", "DATA-IN" and "WRITE" have the formats NRZ, SBC and RT1 (FIGS. 5 and 4). For format SBC or RT1, there are three state changes. For test signals with a lower number of state changes, the number of time planes activated by the circuits, such as the timer for "ADDRESS.GEN.", FIG. 6, or the output of the relevant circuit block 7-1, FIG. 7, corresponds to the number of state changes in the test signal format. The remaining outputs are not considered. In the case of timer 6-31, FIG. 6, the outputs for "B-ADDRESS.GEN." and "C-ADDRESS.GEN." for the data signal "ADDRESS.GEN." are not considered. In the circuit for test signal format generation unrelated to time, outputs 7-132 and 7-133 would be ignored, and only output 7-131 associated with time plane A utilized.

Details of the circuit block 2-0, FIG. 2, are shown in FIG. 7. The block diagram (FIG. 6) shows how test signals are generated from data and timing signals by a series of format and timer circuits each of which is associated with one data signal. This block diagram covers the test signals "ADDRESS", "DATA-IN" and "WRITE" in FIG. 3. The pulse interval generator 6-1 generates pulse intervals (cycles) under program control, as described in the U.S. Pat. No. 4,263,669.

Pulse interval generator 6-1 is connected to a signal generator 6-2 for generating the data signals "ADDRESS.GEN.", "DATA.GEN." and "CONTR.GEN." and to timer circuits for "time synchronization". These signals are also generated under program control, that specifies the digital values marking their curve. Each of these data signals requires one timer, namely, the "ADDRESS.GEN." signal, timer 6-31,
the "DATA.GEN." signal, timer 6-32, and
the "CONTR.GEN." signal, timer 6-33.

Each time generator comprises a number of time planes (in the present example three, A, B and C) corresponding to the number of outputs which, for the timing signals, are designated as "A-ADDRESS.GEN.", "B-ADDRESS.GEN." and "C-ADDRESS.GEN." in the case of 6-31, "A-DATA.GEN.", "B-DATA.GEN." and "C-DATA.GEN." in the case of 6-32, and "A-CONTR.GEN.", "B-CONTR.GEN." and "C-CONTR.GEN" in the case of 6-23. Of these outputs only those corresponding to the desired number of time planes are activated for generating the test signals "ADDRESS", "DATA-IN" and "WRITE". For "ADDRESS" (FIG. 3), only one time plane A is required, so that "A-ADDRESS.GEN." is marked by a heavy line in FIG. 6. As time planes B and C are not required in this case, outputs "B-ADDRESS.GEN." and "C-ADDRESS.GEM." are not considered (which is indicated by a thin line). For "DATA-IN", time planes A, B, C are required, as is indicated by the outputs of 6-32 for "A-DATA.GEN.", "B-DATA.GEN." and "C-DATA.GEN." being marked by heavy lines. For "WRITE", only planes A and B are required, so that the outputs of 6-33 for "A-CONTR. GEN." and "B-CONTR. GEN." are marked by heavy lines.

The format circuit 6-4 consists of three format circuits corresponding to the number of data signals of the signal generator 6-2 (in the present case 3), format circuit 6-41, 6-42 and 6-43. Format circuit 6-41 is connected to the output "ADDRESS.GEN." of the signal generator 6-2 and the timer circuit 6-31. Timer 6-31 and format circuit 6-41 form channel 1 for generating the test signal "ADDRESS".

Format circuit 6-42 is connected to the output of "DATA.GEN." of signal generator 6-2 and timer 6-32 for generating the test signal "DATA-IN". Format circuit 6-42 and timer 6-32 form channel 2.

Format circuit 6-43 is connected to output "CONTR.GEN." of the signal generator 6-2 and timer circuit 6-33 for generating the test signal "WRITE". Format circuit 6-43 and timer circuit 6-33 form channel 3.

The format circuits are identically designed which is shown in detail in the block diagram of FIG. 7.

Figure 8:
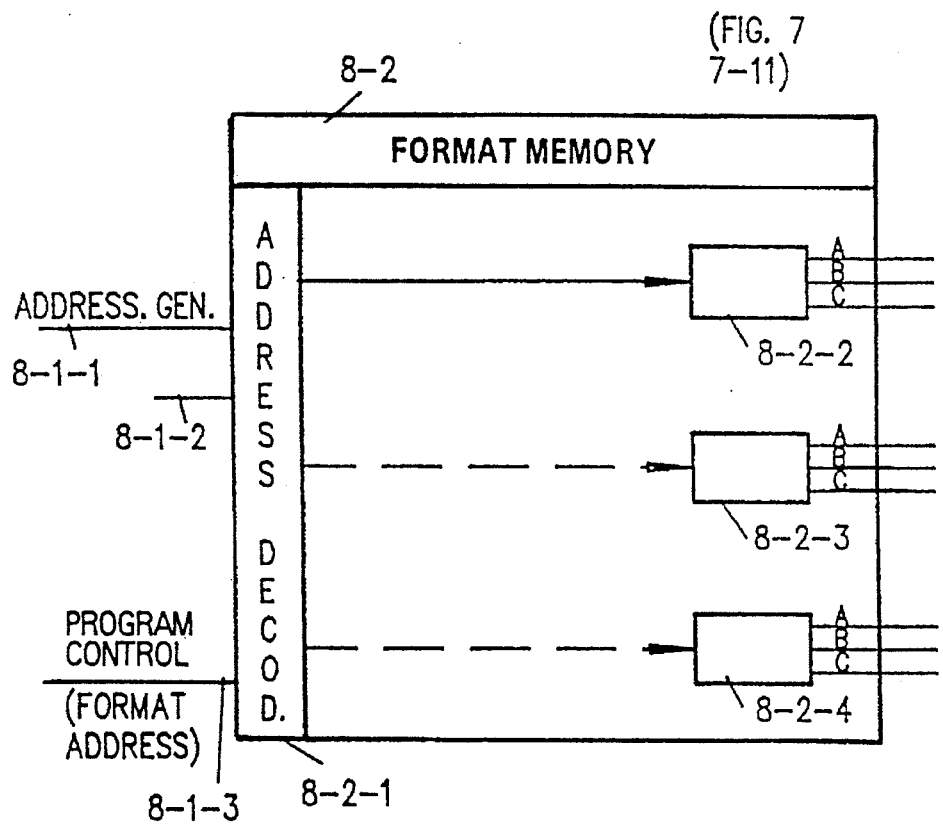
FIG. 8 is a functional survey of a format memory.

The inputs of format memory 7-11 are used for the respective data signal and for information, provided under program control, defining the test signal format. On the basis of this data, the output of the format memory supplies the test signal format information required for the maximum number of time planes. FIG. 8 describes the function of format memory 8-2 in detail by way of the data signal "ADDRESS.GEN.". The "ADDRESS.GEN." information on input line 8-1-1 and an address from the program control means (denoting a fictitious position of the format memory at which test signal format information is stored) on input line 8-1-3 are combined by an address decoder 8-2-1 ADDRESS DECODE. to a current address 8-2-2 at which the test signal format data—in this case NRZ—for time planes A, B and C is stored in the format memory 8-2. For another data signal and/or another fictitious format address, test signal information is read from other format memory positions (say, 8-2-3, 8-2-4).

A second input line 8-1-2 may be provided for binary control information specifying whether the test signal is to have a high or low impedance. This additional information is considered accordingly by address decoder 8-2-1.

In the format memory 8-2, the combined input information on lines 8-1-1, 8-1-2 and 8-1-3 defines a particular address storing data indicating which time plane(s) is (are) to be used to generate the required test signal format and which binary information defines the serial test signal curve (unrelated to time). Thus, format memory 8-2 must be programmed such that the time planes for the test signal formats can be clearly associated for all conceivable signal and format combinations.

Figure 9:
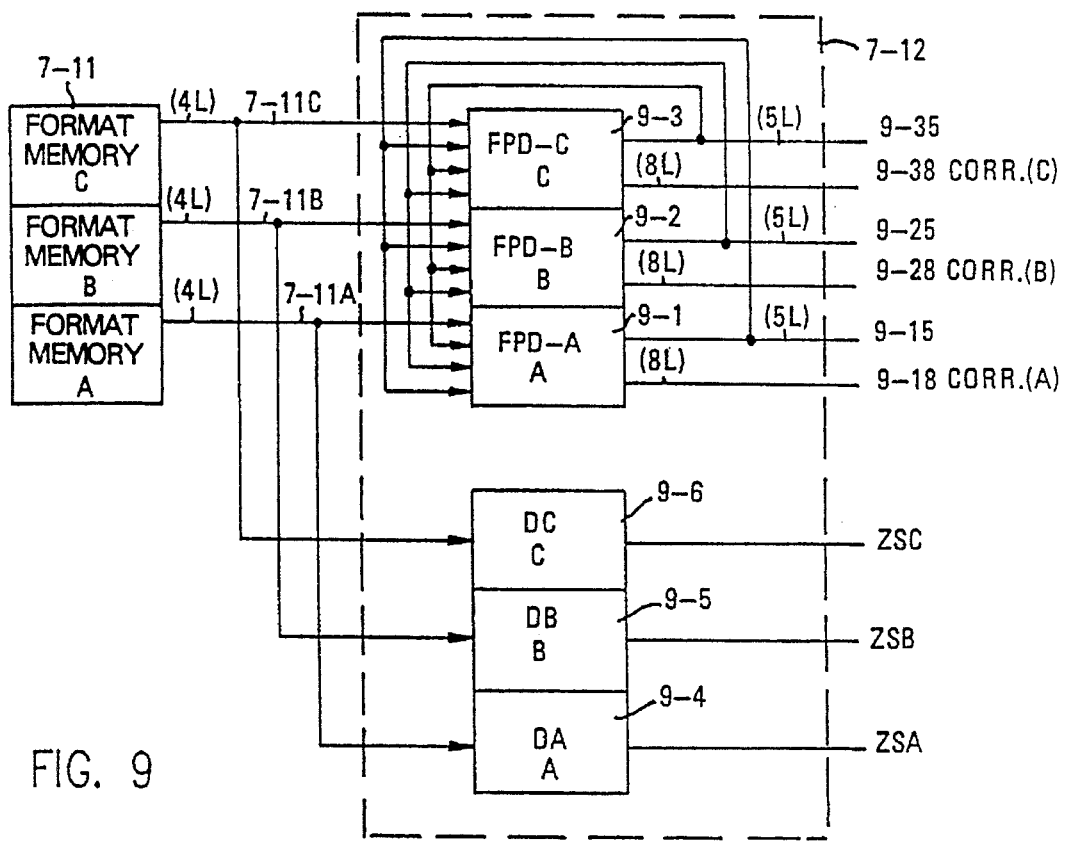
FIG. 9 block diagram of a format predecoder.

Details of the format predecoder 7-12 (FIG. 7) are shown in FIG. 9. The coded signals supplied by format memory 7-11 (FIG. 7) for each time plane (A,B,C) are converted by the format predecoder into signals on particular buses (e.g. 9-15), as will be described in detail below. In addition, the format predecoder is used to provide data signals of previous cycles, to generate the START signals for the time generator, and, using particular buses (e.g. 9-18), to address a correction memory accommodating correction values CORR.(A), -(B),-(C) to compensate for signal delays. On 4 buses (4L), format memory 7-11 supplies binary coded signals for each time plane (A,B,C), namely:

| | |
|---|---|
| 0000 | data = "0" |
| 0001 | data = "1" |
| 0010 | data from the preceding cycle of time plane A |
| 0011 | inverted data from the preceding cycle of time plane A |
| 0100 | data from the preceding cycle of time plane B |
| 0101 | inverted data from the preceding cycle of time plane B |
| 0110 | data from the preceding cycle of time plane C |
| 0111 | inverted data from the preceding cycle of time plane C |
| 1000 | generation of a read amplifier signal (STROBE "0") to determine whether a binary "0" was written as data into a position provided for that purpose in the memory product to be tested (see also FIG. 14) |
| 1001 | generation of a read amplifier signal (STROBE "1") to determine whether a binary "1" was written as data into a position provided for that purpose in the memory product to be tested (see also FIG. 14) |
| 1010 | generation of read amplifier signals (STROBE "0" & "1") to determine whether a binary "0" and/or a "1" was written as data into a position provided for that purpose in the memory product to be tested (see also FIG. 14) |
| 1011 | driver switched to high impedance (see also FIG. 14) |
| 1100 | driver switched to low impedance (see also FIG. 14) |

-continued

| | |
|---|---|
| 1101 | dynamic load disconnected (see also FIG. 14) |
| 1110 | dynamic load connected (see also FIG. 14) |
| 1111 | no operation (NOOP). |

In practice, each of the output buses (7-11A, 7-11B, 7-11C) of the format memory 7-11 constitutes a number of bit lines by which particular bit combinations are represented in parallel.

The bit lines of an output bus, which is associated with one time plane each, carry coded time control information (determining whether and when timing signals signals are to be generated) and actual data (such as "go to 0" or "go to 1"). A predetermined bit combination indicates that one or several time planes are not required for generating a particular test signal (e.g. A-ADDRESS.GEN., FIG. 6, requires only time plane A but not time planes B and C).

The output buses of the format memory 7-11 for each time plane A, B, C are designated as 7-11A, 7-11B, 7-11C in FIGS. 7 and 9. They lead to format predecoder circuits 9-1 FPD-A for time plane A, 9-2 FPD-B for time plane B, and 9-3 FPD-C for time plane C (FIG. 9).

Each of the circuits 9-1, 9-2 and 9-3 comprises a 5-line (5L) output bus 9-15, 9-25 and 9-35, respectively, and an 8-line (SL) output bus 9-18, 9-28 and 9-38, respectively.

The 5-line output buses carry the following information:

| | |
|---|---|
| Data | this line carries the data information "0" or "1" |
| STROBE "0" | a signal on this line means that a read amplifier signal for detecting a "0" is to be generated |
| STROBE "1" | a signal on this line means that a read amplifier signal for detecting a "1" is to be generated |
| 3-STATE | a signal on this line means that the drivers are to be switched to high impedance |
| LOAD | a signal on this line means that a dynamic load is to be connected |

Of these output buses, only the data line is coupled back to the inputs of the format predecoder circuits 9-1, 9-2 and 9-3, so that information on preceding time levels may be provided for each time plane. A format predecoder circuit serves to determine whether the data signal for a time plane is to be changed. Assuming the instruction "go to 1" is to be carried out for the current pulse interval on time plane A to effect the first level change, then this instruction will only be implemented when the level existing after the last change in the preceding interval is other than "1". Only in the latter case, will the timing signal have to be triggered. The information as to the time at which the timing signal is to be provided (calculated from the start of the pulse interval) is stored in the timer in coded form.

Referring level changes to the signal level of the respective preceding pulse intervals requires the memory means 9-1, 9-2, 9-3. If a level change from the preceding pulse interval is required for a time plane of the current interval (e.g. by the instruction "go to 1"), the timing signal is generated at the predetermined time.

The 8-line output buses 9-18, 9-28, 9-38 serve to address a correction memory. This memory accommodates the correction values that have been established to correct differences in test signal delays on different paths leading to the product to be tested (this may be necessary, for example, where the product to be tested is simultaneously subjected to a plurality of data along different paths). The differences mentioned are caused by bus and component tolerances and different signal delays in the pulse shaper or driver circuits (FIGS. 11 and 14) in response to changes in state from binary "0" to "1" or binary "1" to "0".

Such signal delays may be measured and recorded by conventional methods (such as counter-controlled time measurements). For correcting delays, correction values are applied to the circuit for generating the timing signals (this is described with respect to FIG. 4, adder 508, in GE 983 012).

In the present case, this adder would have to comprise an additional adder input for the previously mentioned correction values.

For generating the timing signals, buses 7-11A, 7-11B and 7-11C are coupled to the detector circuits (DA, DB, DC) 9-4, 9-5 and 9-6 for time planes A, B and C. These circuits generate a timing signal (ZSA, ZSB, ZSC) when the 4 input lines of 9-4, 9-5 or 9-6 are carrying information other than the binary combination 1111 (NOOP). In the latter case, no start signal needs to be generated. Such detector circuits are usually implemented as NAND circuits (for positive logic definition).

The format pipeline 7-13, FIG. 7, serves to variably delay the data signals to adapt them to the timing signals. This is necessary for timing signals occurring only at the end of cycle 1 or as late as cycle 2 and which may adversely affect the setting time of flip-flop 7-24 (FIG. 7), as at that stage the data/information may no longer be available at input D of this flip-flop. Therefore, the data/information has to be delayed for timing signals occurring late in a current or subsequent cycle.

Figure 12:
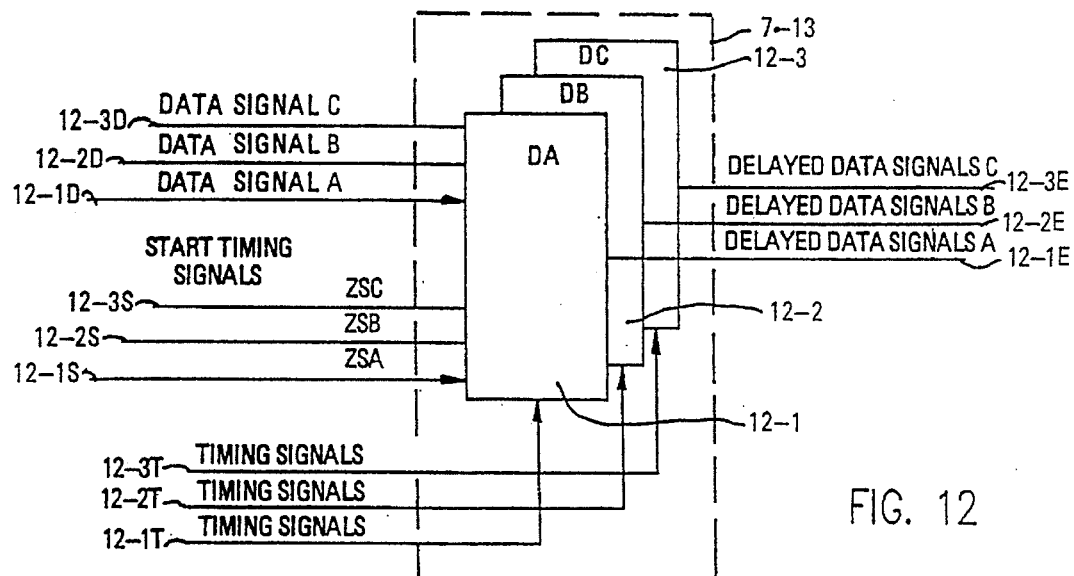
FIG. 12 is a block diagram of the format pipeline circuit (7-13 in FIG. 7)

Format pipeline 7-13 (FIG. 7) is shown in detail in FIG. 12. One delay circuit DA, DB, DC, designated as 12-1, 12-2, 12-3, is provided for each time level A, B, C. Each of these circuits has a data input 12-1D (12-2D, 12-3D), an input 12-1S (12-2S, 12-3S) for the START timing signal, and an input 12-1T (12-2T, 12-3T) for the timing signals of the individual time planes.

Each delay circuit has an output 12-1E, 12-2E or 12-3E for the delayed data signal.

Figure 13:
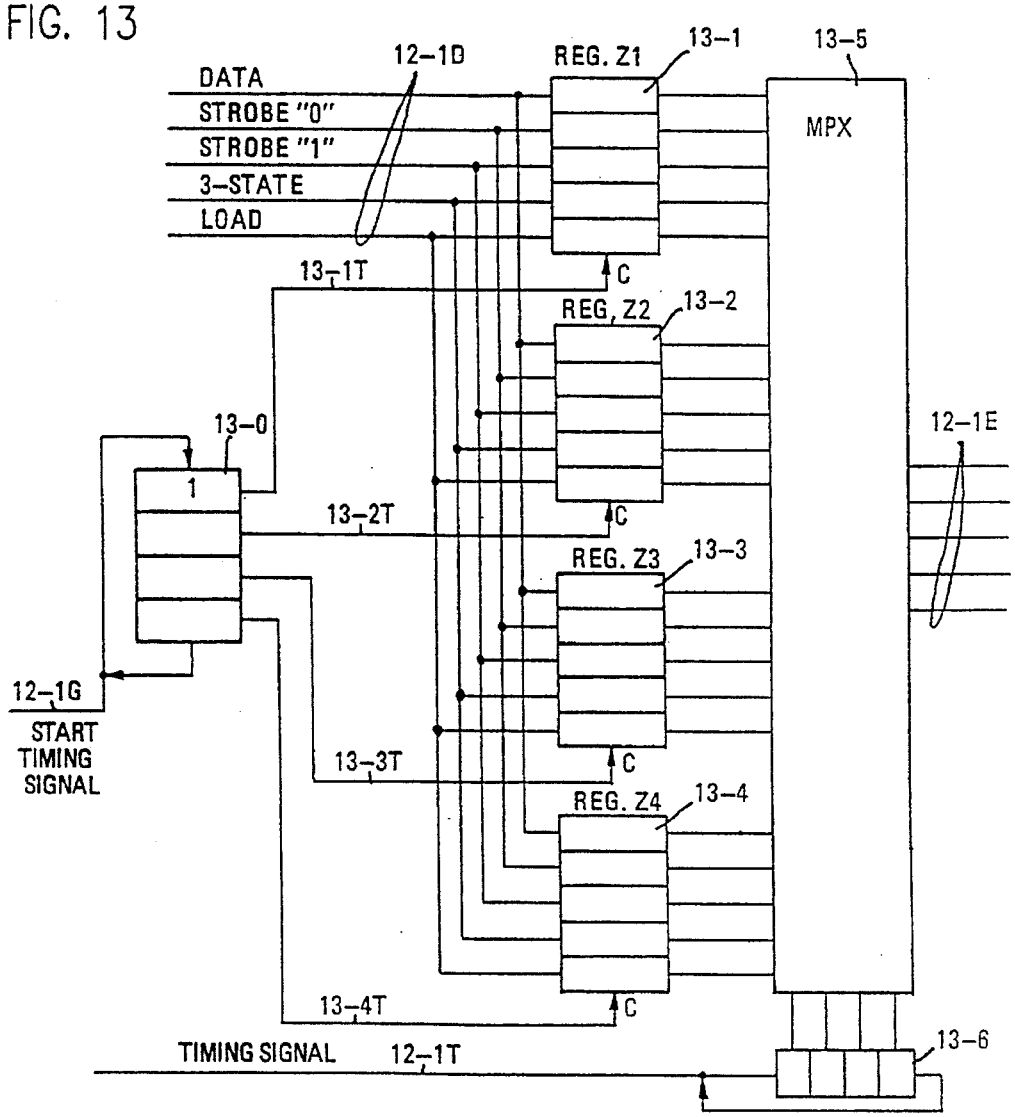
FIG. 13 is a block diagram of a delay circuit for the format pipeline circuit.

Further details of such a delay circuit are shown in FIG. 13. The designations of the input/output lines are the same as those used in FIG. 12. (Such a delay circuit is also described in IBM Technical Disclosure Bulletin Vol. 24, No. 12, May 1982, pp 6488, 6489).

The delay circuit of FIG. 13 is associated with time plane A; for the remaining time planes other circuits are required. This circuit serves to store the values of 4 successive cycles Z1, Z2, Z3, and Z4, so that the values of the first cycle may still be referred to in the fourth cycle.

For storing the values (DATA, STROBE "0", STROBE "1", 3-STATE, and LOAD) for the four cycles, 5-bit registers are provided REG. Z1 (13-1) for the first cycle
REG. Z2 (13-2) for the second cycle
REG. Z3 (13-3) for the third cycle
REG. Z4 (13-4) for the fourth cycle.

These registers are connected to the lines 12-1D (=9-15 in FIG. 9). Each register stores information from lines 12-1D it receives on a clock line 13-1T, 13-2T, 13-3T, 13-4T, and 13-5T; clock line 13-1T is active in cycle 1 and clock line 13-2T in cycle 2.

Each clock line is linked with one stage of a cyclic 4-bit shift register 13-0.

In this shift register a "1" cycles from one stage to another at the clock of the START timing signals on line 12-1S. For the first cycle, the top-most stage or register 13-0 and thus line 13-1T is activated; for the second cycle line 13-2T is activated, etc.

Upon completion of the fourth cycle, the information on lines 12-1D for the fifth cycle is written into REG.Z1 13-1 (in which the information for the first cycle was available up to that stage). Registers 13-1 to 13-4 thus store information for four successive cycles. This information is selectively supplied on output lines 12-1E through a multiplex circuit 13-5. Through the outputs of a cyclic 4-stage shift register 13-6, incremented by the timing signals on line 12-1T, the multiplex circuit MPX 13-5 is activated in four successive cycles.

Figure 10:
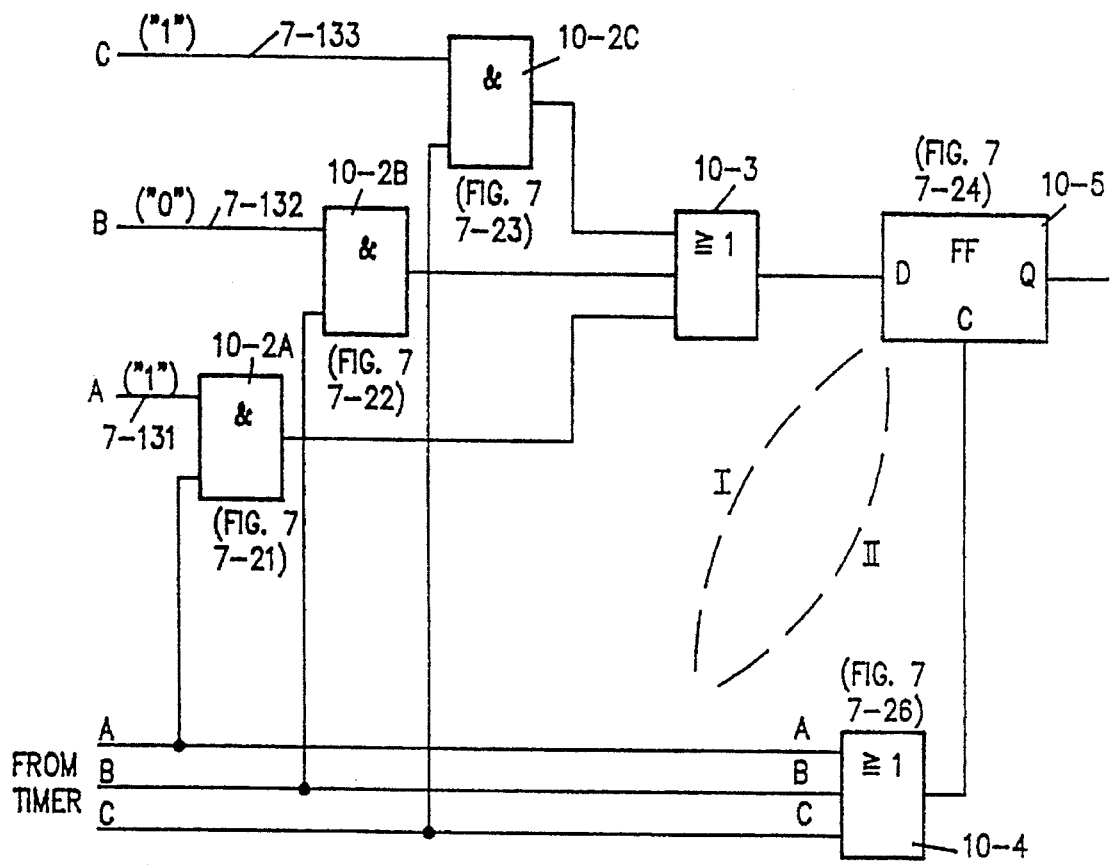
FIG. 10 is a block diagram of a logic circuit (2-3 in FIG. 2 and 7-2 in FIG. 7)

FIG. 10 is a block diagram of the logic circuit (2-3 in FIG. 2, 7-2 in FIG. 7).

This logic circuit serves to generate the test signal from the test signal format information, provided time parallel for each cycle on lines 2-11, 2-12, 2-13, FIG. 2; 7-131, 7-132, 7-133, FIG. 7, and the timing signals (and to combine the test signal format information and the timing signals to a test signal). This means that the time parallel test signal format information of time planes A, B, C has to be converted to suit the desired real time sequence.

Each line 7-131, 7-132, 7-133 is connected to an AND gate (GATE) A 7-21, B 7-22 and C 7-23. Such a gate circuit is required for each of the time planes A, B, C.

The timing signal of the individual time planes A, B, C is directly applied to the second input of each gate circuit. The outputs of all gate circuits are linked by an OR gate 10-3 and connected to the D-input of a flip-flop FF 7-24 for generating the test signal. This flip-flop circuit is clocked through its clock input C by the timing signals which are combined by an OR gate 7-26.

The test signal is emitted at output Q of flip-flop FF 10-5 on line 10-6.

The circuit components of FIG. 10 are provided with additional references indicating to which components of FIG. 7 they correspond.

The timing signals of time planes A, B and C are fed to an OR gate 10-4 for generating a clock signal for a flip-flop circuit FF 7-24 which generates the test signal.

The previously described circuit combines the test signal format information which is supplied unrelated to time and time parallel for each cycle (e.g. the information "go to 1" for time plane A on bus 7-131) with the relevant timing signals (e.g. A-DATA.GEN., FIG. 3, for time plane A) to form the test signal. Thus, for example, the information "go to 1" on line 7-131 is switched by AND gate 10-2A during the pulse TLCO1B of the timing signal A-DATA.GEN (FIG. 3). The AND gates 10-2B, 10-2C and the timing signals of time planes B or C interact analogously.

Figure 1B:
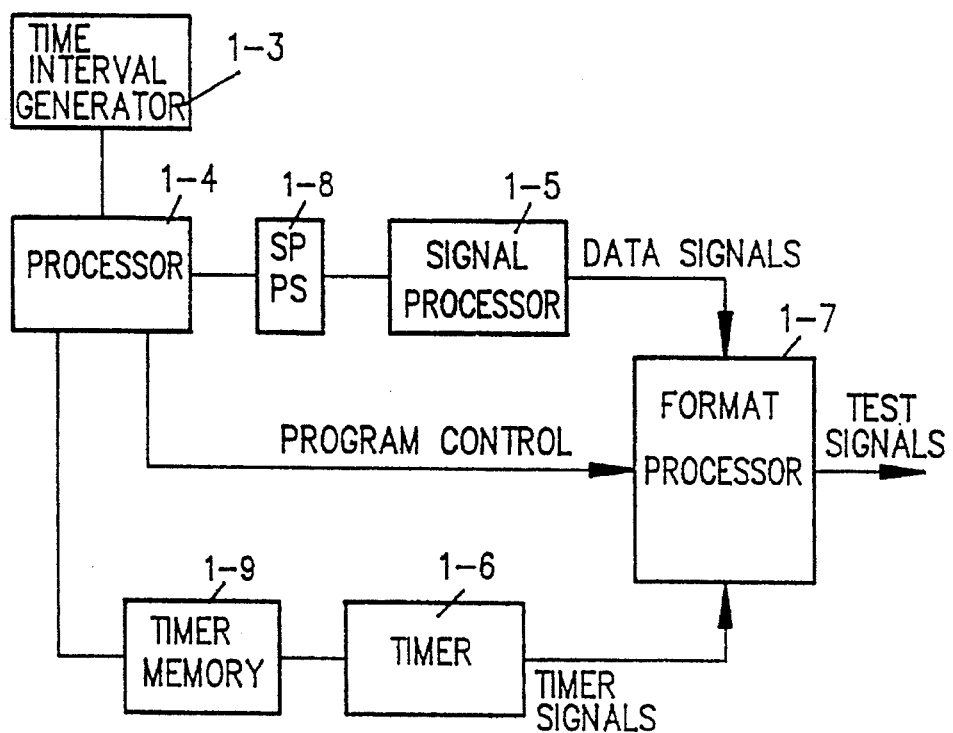
FIG. 1B is a schematic block diagram of a prior art test system considering the generation of data and timing signals.

Each signal change at output Q of flip-flop circuit 10-5 carrying the test signal applied to the product (1-2, FIG. 1) is carried out by the clock signal at input C of this flip-flop circuit. Unlike prior art flip-flop circuits, this flip-flop circuit does not comprise an additional reset input R. As previously mentioned, such an additional reset input leads to different undesired signal delays in such a flip-flop (R reset to Q and S set to Q).

The logic circuit of FIG. 10 has the advantage that different signal delays along logic path 10-2A, 10-2B and 10-2C, and 10-3 do not affect the test signal on line 10-6, which is only controlled by clock input C. Through the OR gate 10-4, the timing signals are directly applied to clock input C without time correction means leading to inaccuracies being required.

For accurate clocking, the circuit of FIG. 10 must meet the following requirement. The signal delay along the path marked II (through 10-4) must not be shorter than that along path I (through 10-2A, B, C, 10-3).

Failure to comply with that requirement would lead to the data signal, which is available at input D of FF 10-5 for a time corresponding to its width, being inadequately controlled by the edge of timing signal at input C. For that time, the controlling edge of the timing signal must be available at input C of FF 10-5, so that the data signal signal is switched to output Q of FF 10-5 when that edge occurs. The time accuracy of the test signal on line 10-6 depends on path II (through 10-4) of FIG. 10.

As the signal delay along path II must not be less than that along path I, it would appear to be necessary to provide an additional delay element along path II. Reason: Along path I there are two delay circuit elements 7-21 and 10-3, whereas along path II there is only one such element (10-4). This may be avoided by applying the inverted OR gate 10-4 output signal to flip-flop FF 7-24 where positive edge triggering is used. The desired additional delay occurring as a result corresponds to the duration of the timing signal.

With the latter approach, the trailing edge of the timing signal determines the time accuracy of the test signal. To ensure a high test signal frequency on line 10-6, OR gate 7-26 must emit short timing signals.

This is in contrast with the less problematical use of longer timing signals but which would lead to an undesired time overlap at OR gate 7-26. To avoid this overlap, each longer timing signal may be fed in a known manner to an AND gate, the second input of which receives the negated and correspondingly delayed timing signal.

Figure 11:
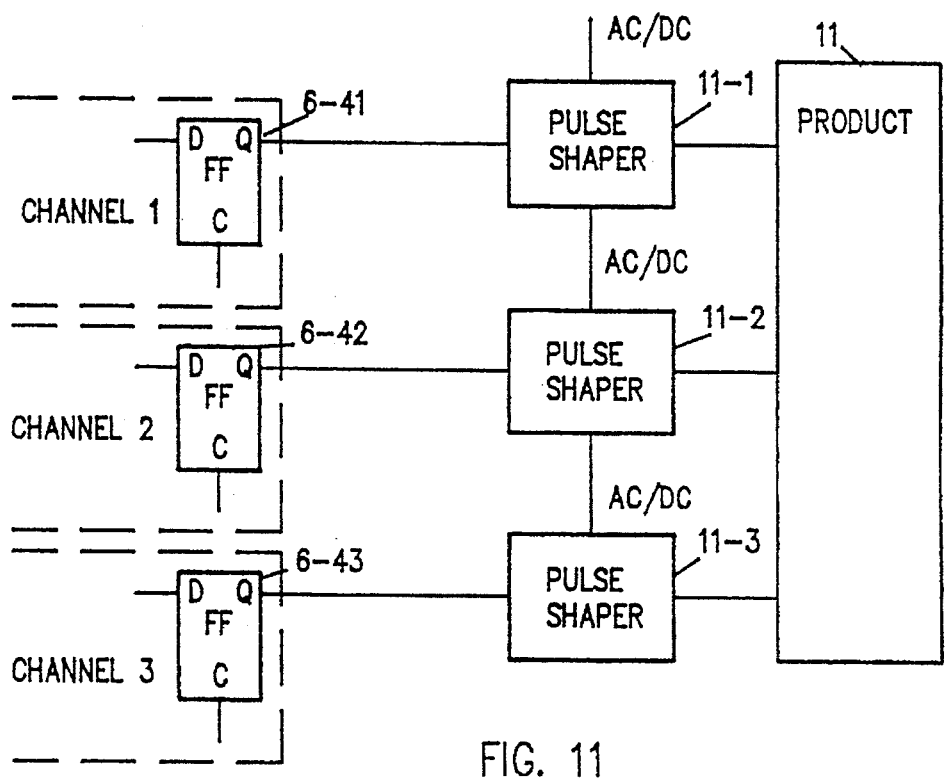
FIG. 11 is a block diagram showing how the test signals are shaped for several channels.

FIG. 11 is a block diagram for pulse shaping the test signals of several channels.

As already mentioned with respect to FIG. 6, different channels (1, 2, 3) are provided for generating different test signals (such as ADDRESS, DATA-IN, WRITE). Each channel consists of a timer and a format circuit.

FIG. 11 shows the output flip-flop circuit 6-41, 6-42, 6-43 for each of the three channels. The function of these flip-flop circuits has been described in conjunction with FIG. 10.

At the Q output of each flip-flop circuit, the test signal is emitted. The test signal emitted at flip-flop circuit 6-41 is fed to pulse shaper 11-1, the test signal of flip-flop circuit 6-42 to pulse shaper 11-2, and the test signal of flip-flop circuit 6-43 to pulse shaper 11-3.

The AC/DC information for the pulse shaper means that prior to function testing by means of test signals (AC=mode with signal changes), the product is DC-tested for leakage currents, etc. in a current/resistance test.

After pulse shaping, the test signals are applied to the product.

Figure 14:
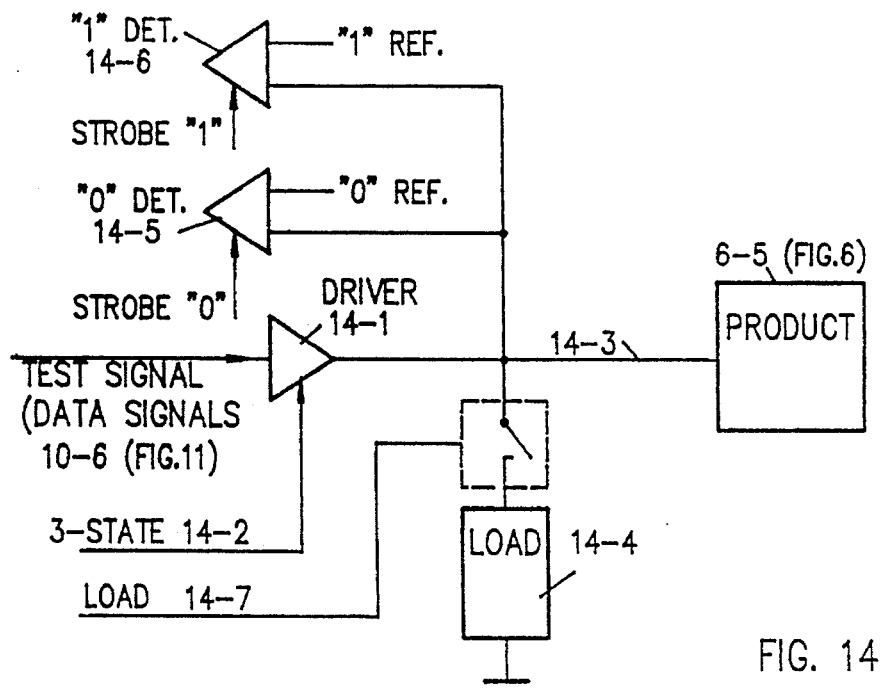
FIG. 14 is a block diagram for function testing a product.

FIG. 14 shows a block diagram for function testing a product. Product 6-5 is subjected to the test signal, taking account of a selectively switched load 14-4 (e.g. resistance, capacity, inductance, etc.). The circuit of FIG. 14 replaces the pulse shaper of FIG. 11 if the test signals are data signals.

The test signal on line 10-6 (FIG. 11) is initially fed to a driver 14-1 (FIG. 14).

It is connected to a control line 14-2 on which it receives the 3-STATE signal. This signal switches the driver output to high impedance (which is necessary, for example, for reading signals from the product). Signal LOAD on line 14-7 leads to a load 14-4 being connected to line 14-3 by which the test signal is applied to the product 6-5 (FIG. 6).

This load depends on the ambient requirements to be observed for product testing. A "0" detector 14-5 and a "1" detector 14-6 are provided to test the information written into addressed product positions, e.g. binary "0" or binary "1". These detector circuits are conventionally designed as analog comparators.

Such a comparator, using a reference value "1" Ref (voltage for a logical "1") or a reference value "0" Ref (voltage for a logical "0"), determines whether the read voltage requested by the product on line 14-3 and derived from the written information corresponds to those reference values. Strobe "1" and/or Strobe "0" signal applied to the comparator determine at a given time (when these signals occur) after the start of the test signal whether the read voltage actually corresponds to a logical "1" or "0" as specified for testing.

The inventive methods and the apparatus described above are not limited to the given particular embodiment which is only exemplary, and the invention is to be limited only by the appended claims. Thus, while the specific embodiment described above is adapted for the test of memory circuits, the principles of the present invention may readily be adapted for the test of other logic circuits, once the principles of the invention as described hereinabove are understood.

What is claimed is:

1. A method for generating product-specific digital test signals for testing a digital circuit, comprising the steps of:
   a) storing at an addressable memory location, digital values representing a test signal curve containing a level of a test pulse and the levels of signals adjacent said test pulse;
   b) generating timing signals from the stored digital values;
   c) sending said digital values along a first path comprising a plurality of signals lines, the plurality of signal lines corresponding to a number of level changes in the pulse, each of the plurality of signal lines being coupled through a first input of a respective AND gate whose output is coupled in common to the input of a first OR gate and whose output is connected through a single bistable flip-flop, to a digital circuit under test;
   d) sending said timing signals to both a second input of said respective AND gate and, a second path, through a second OR gate to a clock input of said single bistable flip-flop to gate said digital values on said plurality of signal lines through said single bistable flip-flop; and
   e) delaying the timing signals in said second path for a period equal to or greater than a period required for the digital signals to traverse said first path.

2. The method as set forth in claim 1 wherein the timing signals are subdivided into a number n of time planes corresponding to a number n of level changes in a test signal curve, with the timing signals for the nth time plane being relative to the nth level change in the test signal curve.

3. A test system for both generating product-specific digital test signals, and addressing and predetermining test data and test functions from data signals and timing signals, wherein the test signals for predetermining test data comprise a test pulse occurring during a pulse interval, wherein the data signals associated with the test signals for each pulse interval comprise data for address, test pulse and function generation, wherein the timing signals for each pulse interval comprise information associated with the data signals, which denotes the start and end of address, test data and function generation in the respective test signals, comprising:
   a) addressable format memory means, coupled to receive the data signals, for storing different test signal formats for each data signal, wherein each particular test signal format denoting a binary voltage curve of voltage levels in a predetermined order of a test signal during a pulse interval;

b) test pulse means for supplying format-specific adjacent signals of the same or a different level;

c) address means coupled to the addressable format memory means, stores the format-specific adjacent signals as digital values denoting the binary voltage curve unrelated in time for each test signal format;

d) reading means for reading the digital values denoting the binary voltage curve for each pulse interval at an output of the addressable format memory means on a number of lines corresponding to a number of level changes in the binary voltage curve;

e) generating means for generating timing signals from digitally stored values denoting a time curve of the test signals; and f) bistable flip-flop means for generating a product specific digital test signal and having a signal delay that is controlled by the timing signals from said generating means and coupled to said reading means to combine with the addressable format memory means output information for the test signal format associated with that data signal in the order of the level changes in the binary voltage curve for generating the test signal.

4. The test system as set forth in claim 3, wherein:

the product-specific digital test signals are time-related to each other;

the timing signals that are generated depend upon the number of level changes in the binary voltage curve; and the binary voltage curve is subdivided into a number of time planes that is equal to the number of level changes in the binary voltage curve.

5. The test system as set forth in claim 3, wherein said reading means comprises a first path having a plurality of signal lines, corresponding to the number of levels changes in the pulse, each line being coupled through a first input of a respective AND gate whose output is coupled in common to the input of a first OR gate and whose output is connected through a single flip-flop to a digital circuit under test;

said generation means are coupled to a second input of said respective AND gate and, along a second path, through a second OR gate to a clock input of said single flip-flop to gate said digital values on said plurality of signal lines through said single flip-flop; and said bistable flip-flop means delays the timing signals in said second path for a period equal to or greater than a period required for the digital signals to traverse said first path.

6. The test system as set forth in claim 3, wherein there is further provided:

a) a format pipeline circuit for providing a variable time delay of the data signals of each time plane b) a cyclic register for a start timing signal, n stages of which are connected to one register each for controlling the storage of said data signal, each of said registers having an output;

c) the number of stages n of the cyclic register corresponds to the number of successive pulse intervals for data signal information to be buffered; and d) the outputs of the registers are connected to a multiplex circuit which is controlled by an n-stage timing signal controlled cyclic register and which successively emits the data signal information for each pulse interval.

7. A test signal generating circuit, comprising:

a) test signal generating means for generating a plurality of test signals that are unrelated to time, and for generating a timer start signal;

b) timer signal generating means for generating a plurality of timing signals in response to receiving the start timer signal; and c) logic means, coupled to receive both the plurality of test signals and the plurality of timing signals, for generating a resultant test signal to be sent to a product under test;

wherein the test signal generating means comprises:

d) an addressable format memory circuit that generates a plurality of formatted coded test signals from a data signal and a program control signal;

e) a format predecoder circuit that both moves the plurality of formatted coded test signals to the correct busses, and generates the timer start signal; and f) a format pipeline circuit that both variably delays the formatted coded test signals, and outputs the plurality of formatted coded test signals that are unrelated to time.

8. A test signal generating circuit, comprising:

a) test signal generating means for generating a plurality of test signals that are unrelated to time, and for generating a timer start signal;

b) timer signal generating means for generating a plurality of timing signals in response to receiving the start timer signal; and c) logic means, coupled to receive both the plurality of test signals and the plurality of timing signals, for generating a resultant test signal to be sent to a product under test;

wherein the test signal generating means comprises:

d) a signal generator, coupled to receive a program control signal, for generating a first signal; and e) a format processor circuit, coupled to receive the program control signal and the first signal, for generating both the timer start signal and the plurality of test signals that are unrelated to time.

9. The circuit in claim 8, wherein:

a) the first signal is an address data signal;

b) the format processor circuit is an address signal format processor circuit for generating both an address timer start signal, and a plurality of address data test signals that are unrelated to time;

c) the timer signal generating means is an address timer for generating an address timing signal; and d) the logic means is an address logic means for generating an address test signal for the product under test in response to both the timer start signal and the plurality of test signals that are unrelated to time.

10. The circuit in claim 8, wherein:

a) the first signal is a data signal;

b) the format processor circuit is a data signal format processor circuit for generating both a data timer start signal, and a plurality of data test signal that are unrelated to time;

c) the timer signal generating means is a data timer for generating a data timing signal; and d) the logic means is a data logic means for generating a data test signal for the product under test in response to both the timer start signal and the plurality of test signals that are unrelated to time.

11. The circuit in claim 8, wherein:

a) the first signal is a write control data signal;

b) the format processor circuit is a write control signal format processor circuit for generating both a write control timer start signal, and a plurality of write control data test signals that are unrelated to time;

c) the timer signal generating means is a write control timer for generating a write control timing signal; and d) the logic means is a write control logic means for generating a write control test signal for the product under test in response to both the timer start signal and the plurality of test signals that are unrelated to time.

12. A signal testing circuit, comprising:

a) a pulse interval generator for generating a pulse signal;

b) a signal generator, coupled to receive the pulse signal, for generating an address data signal, a data signal, and a write control data signal;

c) a format processor circuit, including:
  c1) an address format processor circuit, coupled to receive the address data signal for generating an address timer start signal and a set of address format information signals;
  c2) a data format processor circuit, coupled to receive the data signal for generating a data timer start signal and a set of data format information signals; and
  c3) a write control format processor circuit, coupled to receive the write control data signal for generating a write control timer start signal and a set of write control format information signals;

d) a timer circuit, including:
  d1) an address timer, coupled to receive the pulse signal and the address timer start signal, for generating a set of address timing signals;
  d2) a data timer, coupled to receive the pulse signal and the data timer start signal, for generating a set of data timing signals; and
  d3) a write control timer, coupled to receive the pulse signal and the write control timer start signal, for generating a set of write control timing signals; and e) a logic circuit, including:
  e1) address logic means, coupled to receive the set of address format information signals and the set of address timing signals, for generating an address test signal;
  e2) data logic means, coupled to receive the set of address format information signals and the set of data timing signals, for generating a data test signal; and
  e3) write control logic means, coupled to receive the set of address format information signals and the set of write control timing signals, for generating a write test signal.

* * * * *